United States Patent [19]
Atami et al.

[11] Patent Number: 5,871,581
[45] Date of Patent: Feb. 16, 1999

[54] SINGLE CRYSTAL PULLING APPARATUS

[75] Inventors: Takashi Atami; Hiroaki Taguchi; Hisashi Furuya, all of Tokyo; Michio Kida, Omiya, all of Japan

[73] Assignees: Mitsubishi Materials Silicon Corporation; Mitsubishi Materials Corporation, both of Tokyo, Japan

[21] Appl. No.: 781,841

[22] Filed: Jan. 10, 1997

[30] Foreign Application Priority Data

Jan. 12, 1996 [JP] Japan ................................. 8-004408

[51] Int. Cl.6 .................................................. C30B 35/00
[52] U.S. Cl. ........................... 117/213; 117/200; 117/214
[58] Field of Search .................................. 117/18, 30, 31, 117/33, 200, 213, 214

[56] References Cited

U.S. PATENT DOCUMENTS

| | | | |
|---|---|---|---|
| H520 | 9/1988 | Johnson et al. | 117/14 |
| 5,021,225 | 6/1991 | Yamashita et al. | 117/31 |
| 5,314,667 | 5/1994 | Lim et al. | 117/31 |
| 5,650,008 | 7/1997 | Kou et al. | 117/200 |

*Primary Examiner*—Felisa Garrett
*Attorney, Agent, or Firm*—Pillsbury Madison & Sutro LLP

[57] ABSTRACT

A single crystal pulling apparatus comprising: a gas tight container, a double crucible for storing a semiconductor melt inside the gas tight container comprising an outer crucible and an inner crucible which are connected at a lower edge, and source material supply means for adding source material to the semiconductor melt at a position between the outer crucible and the inner crucible, characterized in that a flow restriction member is provided inside the semiconductor melt region between the outer crucible and the inner crucible for restricting the flow of the semiconductor melt.

5 Claims, 3 Drawing Sheets

SINGLE CRYSTAL PULLING APPARATUS

BACKGROUND OF THE INVENTION

1. Field of the Invention

The present invention relates to a single crystal pulling apparatus for producing a single crystal of a semiconductor such as silicon (Si) or gallium arsenide (GaAs) using a continuous charge magnetic field application CZ technique (hereafter abbreviated as the CMCZ technique), and in particular relates to a single continuous crystal pulling apparatus in which the influence exerted by the introduction of additional source material has been reduced.

2. Description of the Related Art

Single crystal pulling apparatus employing the CZ technique comprises a gas tight chamber, a crucible for storing a semiconductor melt which is positioned inside the chamber, a heater for heating the semiconductor melt, and a pulling mechanism for pulling a single crystal of the semiconductor. In this type of apparatus a seed crystal of the single crystal of the semiconductor is immersed in the semiconductor melt inside the crucible, and the seed crystal is then gradually pulled upwards, growing a large diameter single crystal of the semiconductor which has the same orientation as the seed crystal.

In recent years there has been considerable development of the CMCZ technique, which is a variety of the CZ technique, where continuous pulling is achieved by continuously supplying the source material to the crucible. The CMCZ technique employs an integrated double crucible comprising an inner crucible and an outer crucible which are connected at the lower edge, and a single crystal of the semiconductor is pulled from the inner crucible, while source material is added to the region of the semiconductor melt between the outer and inner crucibles through a source material supply tube made of quartz. The source material supply tube is suspended from the upper portion of the chamber, and the lower end of the tube is proximate to the surface of the semiconductor melt inside the outer crucible. In the CMCZ technique the source material added through the source material supply tube gradually melts in the semiconductor melt, and eventually passes through the connecting portion, which connects the outer and inner crucible at the lower edge of the inner crucible, and flows into the inner crucible, where it is pulled up as a single crystal of the semiconductor. Investigations into the cause of the occurrence of voids in single semiconductor crystals reveal that extensive diffusion into the semiconductor melt in the region of the source material addition will generate voids (referred to herein as a void generation source) and is one factor inhibiting the healthy growth of single crystals of a semiconductor. In particular, if the downward force of the added source material is large or the source material drops in lumps, the depth to which the source material penetrates the semiconductor melt is increased, and so the effects of diffusion of void generation sources are particularly marked.

The present invention takes the above situation into consideration, with the object of providing a single continuous crystal pulling apparatus which enables maximum reduction in the effects caused by diffusion of void generation sources due to source material addition, which is considered one of the major factors inhibiting the healthy growth of single crystals of semiconductors.

SUMMARY OF THE INVENTION

The invention of claim 1 is a single crystal pulling apparatus comprising: a gas tight container, a double crucible for storing a semiconductor melt inside the gas tight container comprising an outer crucible and an inner crucible which are connected at a lower edge, and a source material supply device for adding source material to the semiconductor melt at a position between the outer crucible and the inner crucible, and is characterized in that a flow restriction member is provided inside the semiconductor melt region between the outer crucible and the inner crucible for restricting the flow of the semiconductor melt.

The invention of claim 2 is characterized in that the flow restriction member is a convection current restriction member which restricts convection currents within the semiconductor melt in the region between the outer crucible and the inner crucible.

The invention of claim 3 is characterized in that the flow restriction member is positioned so as to lengthen a path from the source material addition point to the lower edge connecting portion between the outer crucible and the inner crucible.

DESCRIPTION OF THE PREFERRED EMBODIMENTS

Below is a description of each of the embodiments of the present invention with reference to the figures. First, before describing each of the embodiments, an explanation is given with reference to FIG. 4, of the general configuration common to all the embodiments.

Figure 4:
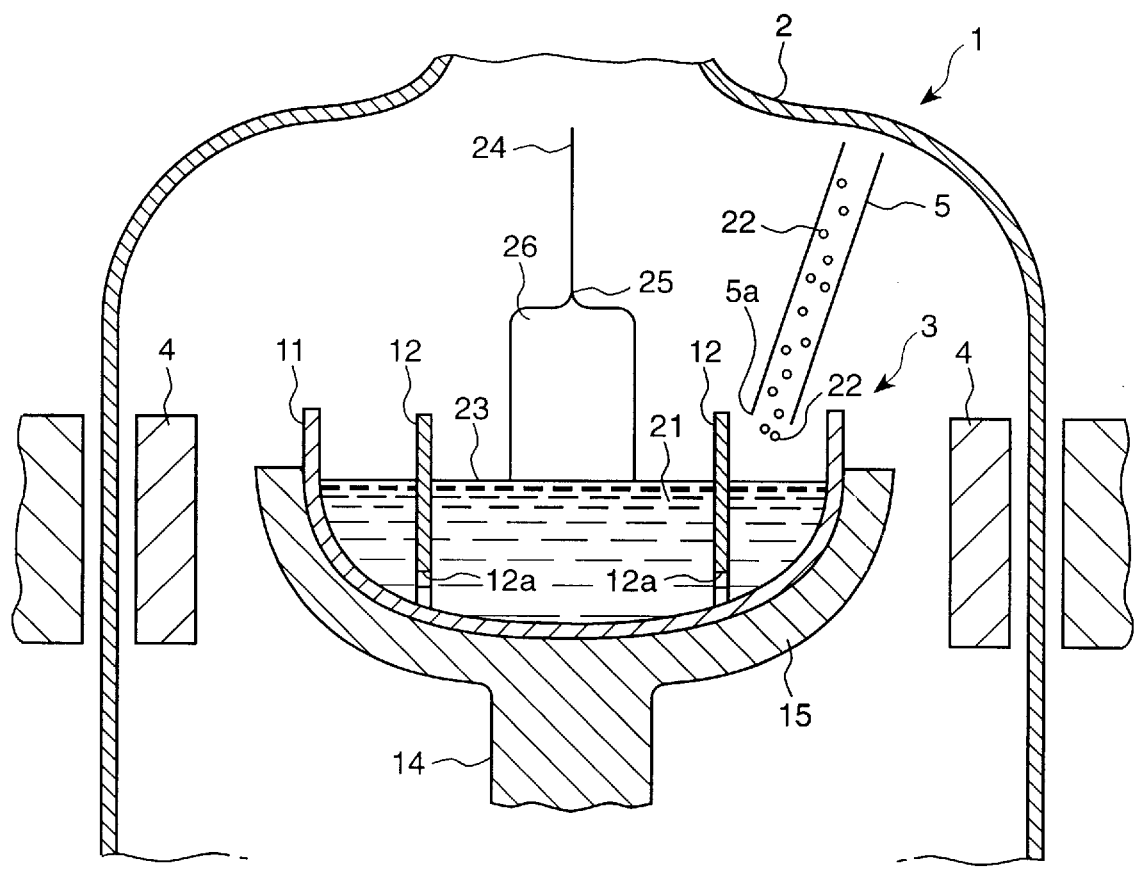
FIG. 4 is a diagram showing the general configuration of a single crystal pulling apparatus common to all the embodiments of the present invention.

As shown in FIG. 4, a double crucible 3, a heater 4, and a source material supply tube (source material supply device) 5 are fitted inside a chamber 2 of a single crystal pulling apparatus 1. The double crucible 3 comprises an approximately hemispherical outer crucible 11 made from quartz, and an inner crucible 12 made from quartz, which is a cylindrical partition body fitted inside the outer crucible 11. Connecting portions 12a for connecting the inner crucible 12 and the outer crucible 11 are formed in the lower portion of the wall of the inner crucible 12.

The double crucible 3 is mounted on a susceptor 15, which sits on a vertical shaft 14 located centrally at the lower portion of the chamber 2., and can be rotated in a horizontal plane, at a specified velocity, about the axis of the shaft 14. Furthermore, a semiconductor melt (the source material for the generation of single crystals of a semiconductor, melted by heating) 21 is stored inside the double crucible 3. The heater 4 heats and melts the semiconductor source material inside the outer crucible 11, and also maintains the temperature of the thus produced semiconductor melt 21. The heater 4 is positioned so as to surround the susceptor 15 and the double crucible 3, and the outside of the heater 4 is surrounded by a heat shield (not shown in the figure) for heat retention purposes.

The source material supply tube 5 is used to continuously supply the granulated source material of the semiconductor melt 21, onto the surface of the semiconductor melt 21a between the outer crucible 11 and the inner crucible 12. Examples of the source materials which can be supplied through the source material supply tube 5 include polysilicon which has been converted to flake form by crushing in a crusher, or polysilicon granules deposited from gaseous source material using thermal decomposition, with further addition, as necessary, of elemental additives known as dopants, such as boron (B) (in the case of production of p-type single crystals of silicon) and phosphorus (P) (in the case of production of n-type single crystals of silicon). In the case of gallium arsenide, the operation is the same as that outlined above,. but in this case, the elemental additive used is either zinc (Zn) or silicon (Si).

A pulling mechanism, and an inlet aperture (both omitted from the figure) for introducing an inert gas such as argon (Ar) into the chamber 2, are positioned in the upper portion of the chamber 2. A pulling wire 24, which forms part of the pulling mechanism, is configured so as to be movable up and down above the double crucible 3 with continuous rotation. A seed crystal of the single crystal of the semiconductor is attached to the tip of the pulling wire 24 via a chuck. The seed crystal is immersed in the semiconductor melt 21 inside the inner crucible 12, and then raised up, and a sequentially grown single crystal of the semiconductor is pulled up in an atmosphere of the inert gas such as argon (Ar) with the seed crystal as the starting point.

With the source material supply tube 5, the source material is inserted at the upper end of the tube, and exits from a lower end opening 5a. The source material supply tube is supported at the upper end and suspended so that the lower end opening 5a is positioned proximately to the outer wall of the outer crucible 11. In order to prevent contamination, and also for workability reasons, the source material supply tube 5 is constructed of a quartz tube with a rectangular cross-section. Furthermore, in order to ensure that the granulated high quality semiconductor source material is supplied to the semiconductor melt 21 at a suitable drop velocity, the inside of the source material supply tube is fitted with alternating ladder type inclined plates which are not shown in the figure.

Moreover, flow restriction members (omitted in FIG. 4) are fitted in the region of the semiconductor melt 21a between the outer crucible 11 and the inner crucible 12, in order to restrict the flow of the semiconductor melt 21a in that region. The flow restriction members suppress the diffusion over a wide area of the aforementioned void generation sources, mainly by restricting convection currents within the semiconductor melt 21a (and thus performing the function of convection current restriction members), and consequently ensure a stable concentration gradient in the region between the source material addition point and the lower edge connecting portions 12a which connect the outer crucible 11 and the inner crucible 12.

Next are explanations of the individual embodiments.

Figure 1:
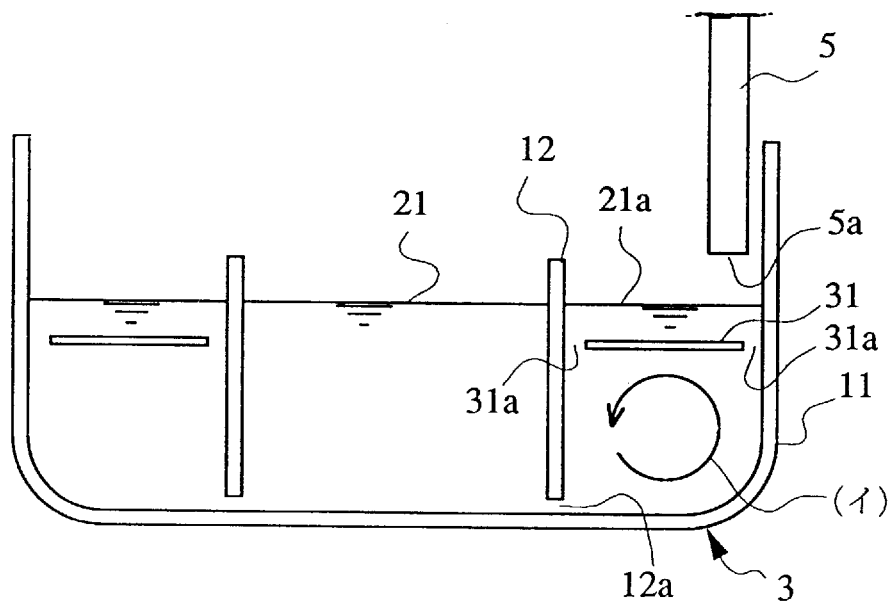
FIG. 1 is a cross-sectional diagram of the essential elements of a first embodiment of the present invention.

A first embodiment is shown in FIG. 1. In this example, a horizontal baffle plate 31 which acts as a flow restriction member and a convection current restriction member is positioned in the region of the semiconductor melt 21a between the outer crucible 11 and the inner crucible 12 at a suitable depth beneath the melt surface. In the example shown in the figure the baffle plate 31 is ring shaped and concentric with the outer crucible 11 and the inner crucible 12, and a connecting clearance 31a is maintained between the inside edge of the baffle plate 31 and the inner crucible 12, and between the outside edge of the baffle plate 31 and the outer crucible 11, to connect the region above the baffle plate 31 with the region below. The baffle plate 31 can be either supported from the inner crucible 12 or from the source material supply tube 5. Moreover, the baffle plate 31 does not need to be continuous around the whole circumference so long as the plate covers a predetermined area below the source material supply tube 5, and in this case it is preferable if the baffle plate 31 is supported from the source material supply tube 5.

Because of the presence of the baffle plate 31 in this construction, the impact of the source material on the semiconductor melt 21a during addition of the source material is reduced. Void generation sources introduced through the addition of the source material gradually diffuse into the semiconductor melt 21a around the inside and outside edges of the baffle plate 31. At this point, the influence of convection currents within the semiconductor melt 21a, shown by the arrow (X) in the figure, is interrupted by the baffle plate 31 and does not extend to the portion above the baffle plate 31, and so in addition to the impact easement effect during addition of the source material, the diffusion of void generation sources is suppressed to a minimum and a stable concentration gradient is maintained in the region from the surface of the semiconductor melt 21a to the lower edge connecting portions 12a which connect the outer crucible 11 and the inner crucible 12.

Figure 2:
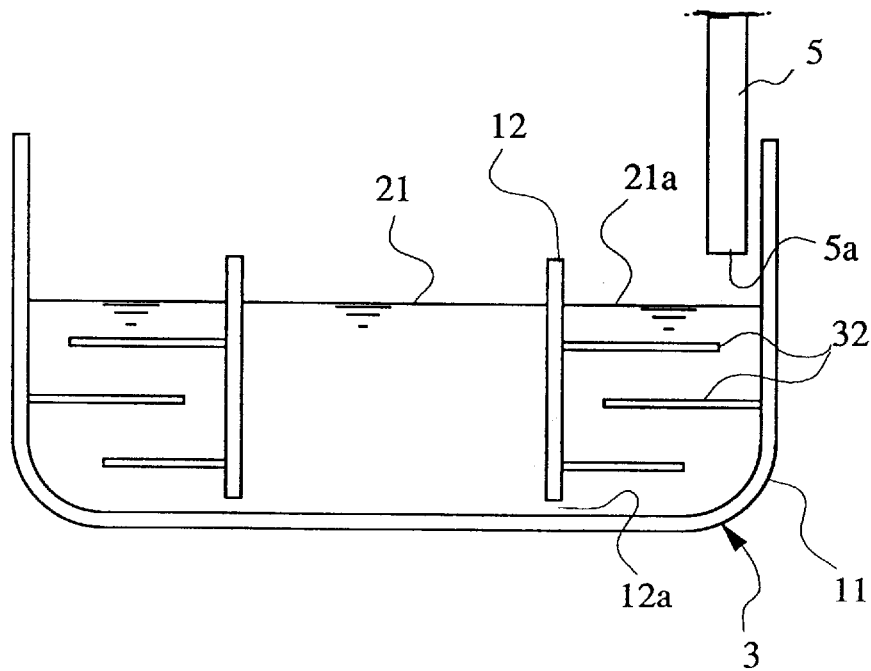
FIG. 2 is a cross-sectional diagram of the essential elements of a second embodiment of the present invention.

A second embodiment is shown in FIG. 2. In this example, a plurality of baffle plates 32 (two levels of plates are present in the example shown) are fitted one below the other. Furthermore, by offsetting each level of baffle plate either towards the outside or the inside of the crucible, the connecting clearances 32a which connect the region above each baffle plate 32 with the region below, are positioned alternately on the outside and then the inside of alternate baffle plates 32. Consequently, the length of the path from the point of source material addition to the semiconductor melt 21a, to the lower edge connecting portions 12a between the outer crucible 11 and the inner crucible 12 is increased.

Because of the presence of the plurality of baffle plates 32 in this construction, convection currents in the semiconductor melt 21a are further suppressed, and the diffusion of void generation sources is further restricted. Because the length of the path from the point of source material addition to the semiconductor melt 21a, to the lower edge connecting portions 12a between the outer crucible 11 and the inner crucible 12 is large, the likelihood of any influence at the source material addition point extending as far as the inner crucible 12 is reduced, ensuring an even more stable concentration gradient.

Moreover, instead of using a plurality of baffle plates positioned independently one below the other, a continues spiral type plate can also be used.

Figure 3:
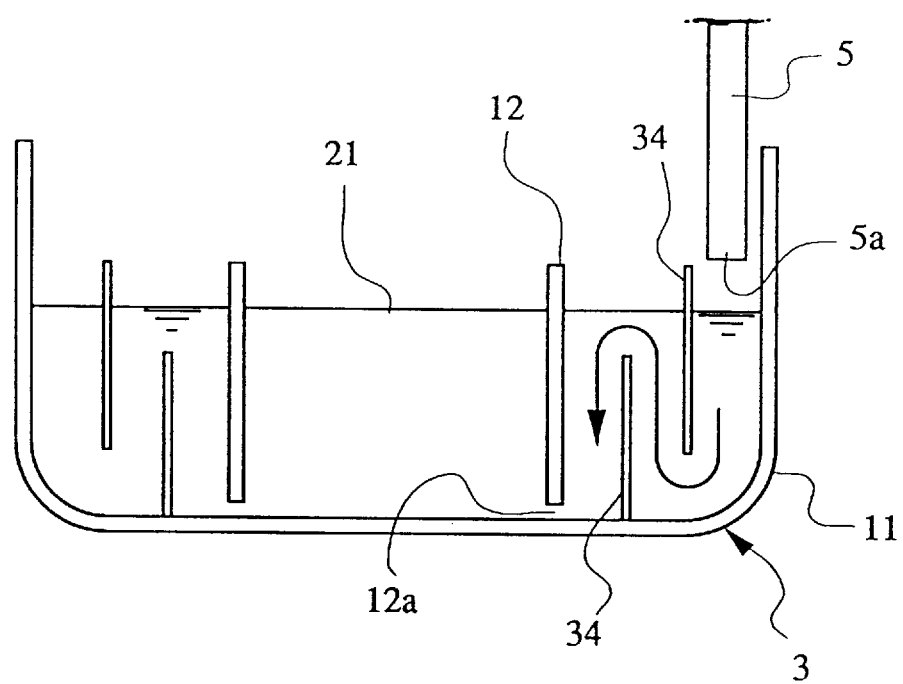
FIG. 3 is a cross-sectional diagram of the essential elements of a third embodiment of the present invention.

A third embodiment is shown in FIG. 3. In this example, two vertical partitioning walls 34b and 34c are positioned on the inner perimeter and outer perimeter, and are offset alternately either upwards or downwards, so that connecting portions 34a and 34a' are maintained at the lower edge of an outer perimeter partitioning wall 34b and at the upper edge of an inner perimeter partitioning wall 34c, thus maintaining the connection between the region outside each wall with the region inside. Consequently, the configuration allows a lengthening of the path from the point of source material addition to the semiconductor melt 21a (the point on the melt surface directly below the lower end opening 5a of the source material supply tube 5), to the lower edge connecting portions 12a between the outer crucible 11 and the inner crucible 12.

Due to the existence of the two vertical partitioning plates 34b, 34c, large convection currents within the semiconductor melt 21a are suppressed, and the diffusion of void generation sources over a wide area due to the influence of convection currents is suppressed. Furthermore, because the length of the path from the point of source material addition, to the lower edge connecting portions 12a between the outer crucible 11 and the inner crucible 12 is large, a stable concentration gradient is ensured.

Moreover, the way in which the flow restriction members are fitted is not limited to the methods employed in the embodiments described above, and any fitting method which produces an embodiment which displays a convection current suppression effect within the semiconductor melt 21a and restricts the overall flow is possible.

As explained above, with the invention according to claim 1, flow restriction members are provided in the semiconductor melt region between the outer crucible and inner crucible, which is the region where the added source material is melted, and so the overall flow within this region can be restricted, and the diffusion of void generation sources introduced with the addition of the source material can be suppressed. Consequently, a major factor inhibiting the healthy growth of single crystals of the semiconductor can be reduced to a minimum.

Furthermore, with the invention according to claim 2, convection currents in the semiconductor melt, mainly in the region between the outer crucible and the inner crucible, are suppressed by flow restriction members, and so the accelerating action which convection currents exert on the diffusion of void generation sources can be suppressed, ensuring the healthy growth of single crystals of the semiconductor.

Furthermore, in the case where the path from the source material addition point to the portion where the semiconductor melt flows through to the inside of the inner crucible is lengthened as with the invention according to claim 3, a stable concentration distribution can be produced along the path, enabling further prevention of the occurrence of voids in single crystals of the semiconductor.

What is claimed is:

1. A single crystal pulling apparatus comprising:

a gas tight container;

a double crucible for storing a semiconductor melt inside the gas tight container, said double crucible including an outer crucible and an inner crucible connected at a lower edge;

source material supply means, disposed between the outer crucible and the inner crucible, for continuously adding source material to the semiconductor melt; and a flow restriction member, disposed inside the semiconductor melt region between the outer crucible and the inner crucible, for restricting the flow of the semiconductor melt.

2. A single crystal pulling apparatus according to claim 1, wherein said flow restriction member is a convection current restriction member which restricts convection currents within the semiconductor melt in the region between the outer crucible and the inner crucible.

3. A single crystal pulling apparatus according to claim 2, wherein said flow restriction member is positioned so as to lengthen a path from the source material addition point to the lower edge connecting portion between the outer crucible and the inner crucible.

4. A single crystal pulling apparatus according to claims 1 or 2, wherein said flow restriction member is configured as a baffle plate, formed as a ring-shaped structure, concentric with the outer crucible and the inner crucible, and positioned horizontally to the surface of the semiconductor melt.

5. A single crystal pulling apparatus according to claim 4, wherein said baffle plate is provided below a portion of the source material supply means, and is supported by said source material supply means.

* * * * *